United States Patent
Aoki et al.

(10) Patent No.: US 7,756,232 B2
(45) Date of Patent: Jul. 13, 2010

(54) CLOCK AND DATA RECOVERY CIRCUIT

(75) Inventors: Yasushi Aoki, Kanagawa (JP); Takanori Saeki, Kanagawa (JP); Koichiro Kiguchi, Kanagawa (JP)

(73) Assignee: NEC Electronic Corporation, Kawasaki, Kanagawa (JP)

( * ) Notice: Subject to any disclaimer, the term of this patent is extended or adjusted under 35 U.S.C. 154(b) by 936 days.

(21) Appl. No.: 11/510,669

(22) Filed: Aug. 28, 2006

(65) Prior Publication Data

US 2007/0047686 A1 Mar. 1, 2007

(30) Foreign Application Priority Data

Aug. 29, 2005 (JP) .............................. 2005-248285

(51) Int. Cl.
*H04L 7/00* (2006.01)
*H03D 3/24* (2006.01)
*H03L 7/06* (2006.01)
(52) U.S. Cl. .................... 375/355; 375/374; 327/146
(58) Field of Classification Search ................. 375/355, 375/371, 373, 374, 141, 146, 151, 155; 327/141, 327/146, 151, 155
See application file for complete search history.

(56) References Cited

U.S. PATENT DOCUMENTS 6,753,712 B2 6/2004 Saeki

2002/0079938 A1 6/2002 Saeki
2004/0091073 A1* 5/2004 Smith et al. .................. 375/355
2004/0208270 A1* 10/2004 Schmatz et al. ............. 375/355

FOREIGN PATENT DOCUMENTS

JP 2002-190724 7/2002
JP 2003-333021 11/2003

OTHER PUBLICATIONS

Mark Horowitz, et al., "PLL Design for 500 MB/s Interface", ISSCC, 1993 pp. 160-161.

* cited by examiner

*Primary Examiner*—Betsy L Deppe
(74) *Attorney, Agent, or Firm*—McGinn IP Law Group, PLLC

(57) ABSTRACT

Disclosed is a clock and data recover circuit including N flip-flops (F/Fs) for sampling an input data signal using N-phase clocks, a phase comparison circuit for performing phase comparison based on outputs of the F/Fs, a filter or smoothing a result of the phase comparison and outputting an up/down signal, up/down counters, each for receiving an output of the filter and counting up or down a count value thereof, a phase shift circuit for adjustably controlling phases of the clocks for edge detection and the clocks for data sampling according to phase control signals from an up/down counter and an up/down counter, respectively, and an up/down control circuit for receiving a control signal for controlling maximum and minimum values of count values of the up/down counter, generating a signal for controlling counting up and down of the up/down counter based on the count value of the up/down counter, and supplying the generated signal to the up/down counter.

20 Claims, 6 Drawing Sheets

CLOCK AND DATA RECOVERY CIRCUIT

FIELD OF THE INVENTION

The present invention relates to a circuit for extracting a clock signal from received data, thereby recovering data. More specifically, the invention relates to a circuit suitable for being applied to a serial interface and a semiconductor device.

BACKGROUND OF THE INVENTION

FIG. 4 is a diagram showing an example of a typical configuration of a clock and data recovery circuit. As regard to the clock and data recovery circuit, a description in Patent Document 1 is referred to. Referring to FIG. 4, this clock and data recovery circuit receives an input data signal and includes N latch circuits 102 (constituted from F/F1 to F/FN) for sampling the input data signal in response to a multi-phase clock signal (constituted from N-phase clocks CK1 to CKN), respectively, from a phase shift circuit 101, and for outputting sampled signal, a phase comparison circuit 103 for receiving outputs from the N latch circuits 102, for phase comparison, and outputting an up/down signal based on a result of the comparison, a filter 104 for smoothing an output of the phase comparison circuit 103, an up/down counter 105 for receiving the up/down signal smoothed by the filter 104, and performing counting up and counting down when the up/down signal indicates an up operation and a down operation, respectively, and a phase shift circuit 101 for receiving a phase control signal from the up/down counter 105 and performing control to advance or delay phases of the N-phase clock signals. The N-phase clock signals generated by dividing a reference clock signal from a PLL circuit not shown by a frequency divider circuit not shown are supplied to the phase shift circuit 101. The phase shift circuit 101 is constituted from a phase interpolator for changing the phases of the input N-phase clock signals according to the phase control signal.

The input data signal is sampled by the latch circuits 102 (constituted from the F/F1 to F/FN) in response to the N-phase clock signals. To the odd-numbered F/Fs, the clock signals each of which has a rising (or falling) edge in the vicinity of a center of a data settlement period are supplied, as clock signals for data sampling each for sampling the input data signal. To the even-numbered F/Fs, the clock signals each of which has a rising (or falling) edge in the vicinity of a point of change in data are supplied, as clock signals for edge detection each for detecting a transition point of the input data. Respective data sampled by the F/F1 to F/FN are supplied to the phase comparison circuit 103. The data sampled by the odd-numbered F/Fs are output as output data. The phase comparison circuit 103 compares the data sampled in mutually adjacent phases, thereby determining the point of change of the input data. When the phase of the clock signal lags behind the phase of the input data signal, the phase comparison circuit 103 outputs the up signal. When the phase of the clock signal leads the phase of the input data signal, the phase comparison circuit 103 outputs the down signal.

The filter 104 receives the up/down signal output from the phase comparison circuit 103 to generate the smoothed up/down signal by a majority decision circuit or the like.

The up/down counter 105 generates the phase control signal for the phase shift circuit 101 so that when the up/down counter 105 receives the up signal from the filter 104, the up/down counter 105 makes the phases of the N-phase clock signals CK1 to CKN "up" (advances the phases of the clock signals CK1 to CKN relative to the phase of the input data signal), and when the up/down counter 105 receives the down signal from the filter 104, the up/down counter 105 makes the phases of the clock signals "down" (the phases of the clock signals CK1 to CKN are delayed relative to the phase of the input data signal).

The phase control signal output from the up/down counter 105 to the phase shift circuit 101 is made common to the clock signals for data sampling the input data and the clock signals for edge detection at the latch circuits 102. That is, delays and advances in the phases of the N-phase clock signals CK1, CK2, CKN-1, and CKN from the phase shift circuit 101 (with the phases of the mutually adjacent clock signals spaced to each other by 360/N degrees) are controlled in common.

Generally, in a locked state (in the state where the phase of each of the clock signals for data sampling is located in the vicinity of the center of a data bit determination period) of the clock and data recovery circuit, the phase of each of the clock signals for detecting the transition (edge) of the input data signal is controlled to repeat going up and down around the point of the change of the input data signal.

As described above, the clock signal data recovery circuit shown in FIG. 4 is configured to phase shift all of the multi-phase clocks in unison at equal intervals. That is, as shown in FIG. 5 as a timing waveform diagram, the clock signals for edge detection each for detecting the transition point of the input data and the data sampling clock signal for sampling the input data at a data determination point are controlled by the common phase control signal. Accordingly, when an edge of one of the clock signals for edge detection (refer to an arrow mark in FIG. 5) changes, an edge of one of the clock signals for data sampling (refer to an arrow mark in FIG. 5) changes with the same phase as that of this signal. That is, when edge detection and data bit content are sampled by the latch circuits 102 in FIG. 4 using the clock signals of two phases and when the transition point of the data is delayed in a certain cycle due to jitter of the input data signal or like, the transition point of the data may come earlier in the subsequent cycle (with a period of the cycle reduced). In this case, when the edge detecting clock signal and the data sampling clock signal are delayed by the same phase, incorrect sampling of a data bit such as sampling of a transition region of the subsequent cycle (a data bit boundary) as the data bit may be performed (as described in Patent Document 2).

Patent Document 2 proposes a clock and data recovery circuit that controls the clock signals for data sampling and the clock signals for edge detection for input data separately, as shown in FIG. 6, as the clock and data recovery circuit that has suppressed an influence caused by a jitter component and has enabled correct data sampling. Referring to FIG. 6, component arrangement and the like of FIG. 6 are slightly different from a configuration described in a drawing in Patent Document 2 so as to obtain correspondence with FIG. 4. However, a basic configuration of FIG. 6 is the same as that in Patent Document 2. Referring to FIG. 6, this clock and data recovery circuit includes a control circuit 106 between the up/down counter 105 and the phase shift circuit 101 in the configuration in FIG. 4. The control circuit outputs two phase control signals for respectively controlling the clock signals for data sampling (odd-numbered clock signals) and the clock signals for edge detection (even-numbered clock signals) for input data separately.

[Patent Document 1]
   Japanese Patent Kokai Publication No. JP-P2002-190724A
[Patent Document 2]
   Japanese Patent Kokai Publication No. JP-P2003-333021A
[Non-patent Document 1]

ISSCC 1993 p.p. 160-161 Mark Horowitz et al., "PLL Design for 500 MB/s Interface"

SUMMARY OF THE DISCLOSURE

In the clock and data recovery circuit shown in FIG. 4, even when ideal data (with no jitter and a 50/50% duty ratio, for example) is supplied, jitter corresponding to one stage of the phase shift circuit 101 even at a minimum is generated in the data sampling clock signal.

On the other hand, the configuration in FIG. 6 designed to improve immunity against the jitter controls the clock signals for data sampling and the clock signals for edge detection for input data, separately. However, control over maximum segments of respective phase shifts of the clock signals for data sampling and the clock signals for edge detection is not performed. For this reason, inventors of the present invention have known a problem that the jitter of the data sampling clock signal with respect to the jitter component of the input data signal that changes according to a use condition sometimes cannot be suppressed for minimization.

The invention disclosed in this application is generally configured as follows.

A clock and data recovery circuit according to one aspect of the present invention includes:

a plurality of latch circuits for receiving and sampling an input data;

a phase shift circuit for supplying multiple phases of clock signals having phases spaced each other to said plurality of latch circuits, respectively; and a circuit unit for generating phase control signals each for controlling a delay or an advance in the phase of the clock signal of the multiple phases of clock signals supplied to said plurality of latch circuits from said phase shift circuit, based on a result of phase comparison using data sampled by said latch circuits and supplying the generated phase control signals to said phase shift circuit;

predetermined ones of the multiple phases of clock signals being set as clock signals for edge detection each for detecting a transition point of an input data signal and the other clock signals being set as data sampling clock signals for sampling the input data signal, respectively, said phase shift circuit adjustably shifting the phases of the clock signals for edge detection and the phases of the data sampling clock signals based on the phase control signals, thereby recovering the data and the clock signal;

said circuit unit including at least an up/down counter subjected to an up/down control based on the result of the phase comparison and performing control so that control over the phases of the clock signals for edge detection is performed by one of the phase control signals in accordance with a count value of said up/down counter subjected to an up/down control based on the result of the phase comparison; and control over the phases of the data sampling clock signals is made by step-wise variable control in which the phases of the data sampling clock signals are advanced or delayed when a combination of the current count value of the up/down counter and the result of the phase comparison satisfies a predetermined condition, without directly following the count value of said up/down counter subjected to the up/down control based on the result of the phase comparison.

In the present invention, the control over the phases of the clock signals for edge detection is performed by the one of the phase control signals in accordance with the count value of the up/down counter subjected to the up/down control based on the result of the phase comparison. For controlling the phases of the clock signals for data sampling, the clock and data recovery circuit includes:

a control circuit for performing control so that when the current count value of the up/down counter in a first stage subjected to the up/down control based on the result of the phase comparison satisfies a predetermined condition and also when the result of the phase comparison indicates the delay or the advance of the phases, the second up/down counter is counted up or down. The phases of the clock signals for data sampling are controlled by an other one of the phase control signals in accordance with a count value of the up/down counter in the second stage.

The present invention may be so configured that a control signal for controlling maximum and minimum values of the count values of the up/down counter in the first stage for controlling the phases of the clock signals for data sampling is supplied, so that the maximum and minimum values of the up/down counter in the first stage can be thereby adjustably set.

The present invention may be so configured that a count value range of the up/down counter in the first stage for controlling the phases of the clock signals for data sampling is set to be narrower than a count value range of the up/down counter in the second stage.

A clock and data recovery circuit according to the present invention includes:

a plurality of latch circuits for sampling an input data signal responsive to multiple phases of clock signals having phases spaced each other, and for outputting sampled signals, respectively;

one group of said latch circuits receiving clock signals for edge detection among said multiple phases of clock signals, respectively to detect a transition point of the input data signal; and the other group of said latch circuits receiving clock signals for data sampling among said multiple phases of clock signals, respectively to sample the input data signal;

a phase comparison circuit for receiving outputs of said plurality of latch circuits, detecting an advance or a delay in the phase of the clock signal relative to the phase of the input data signal based on outputs of said plurality of latch circuits and for outputting an up/down signal;

a filter for smoothing the up/down signal from said phase comparison circuit and for outputting the smoothed up/down signal;

a first up/down counter for receiving the up/down signal from said filter, counting up or down a count value thereof, and for outputting a first phase control signal;

a second up/down counter for outputting a second phase control signal;

a third up/down counter for receiving the up/down signal from said filter and for counting up or down a count value thereof;

a phase shift circuit for receiving the first phase control signal from said first up/down counter and the second phase control signal from said second up/down counter and for variably and separately controlling phases of the clock signals for edge detection and phases of the clock signals for data sampling, respectively; and an up/down control circuit for receiving the count value of said third up/down counter and the up/down signal from said filer and for generating a signal controlling counting up or down of said second up/down counter based on the count value of said third up/down counter and the up/down signal from said filter to supply the so generated signal to said second up/down counter.

In the present invention, a control signal for controlling maximum and minimum values of the count values of the third up/down counter is received by the third up/down counter, so that the maximum and minimum values of the count values of the third up/down counter can be variably set.

In the present invention, the up/down control circuit outputs the up signal to the second up/down counter when the count value of the third up/down counter is a maximum value and when the up/down control circuit receives the up signal from the filter; and the up/down control circuit outputs the down signal to the second up/down counter when the count value of the third up/down counter is a minimum value and when the up/down control circuit receives the down signal from the filter.

In the present invention, a count value range of the third up/down counter is set to be narrower than a count value range of the second up/down counter.

An interface circuit according to other aspect of the present invention includes:

the clock and data recovery circuit; and an input buffer.

The clock and data recovery circuit receives input serial data from the input buffer. The interface circuit includes:

a selector for receiving a data signal output from the clock and data recovery circuit and transmitted serial data, and outputting one of the data signal and serial data for transmission; and an output buffer for receiving an output of the selector, for output.

The meritorious effects of the present invention are summarized as follows.

According to the present invention, phase adjustment of the clock signals for data sampling is performed in stages through the up/down counters and the up/down control circuit, compared with phase adjustment of the clock signals for edge detection. A jitter component of the data sampling clock signal can be thereby suppressed, so that data can be extracted correctly. Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
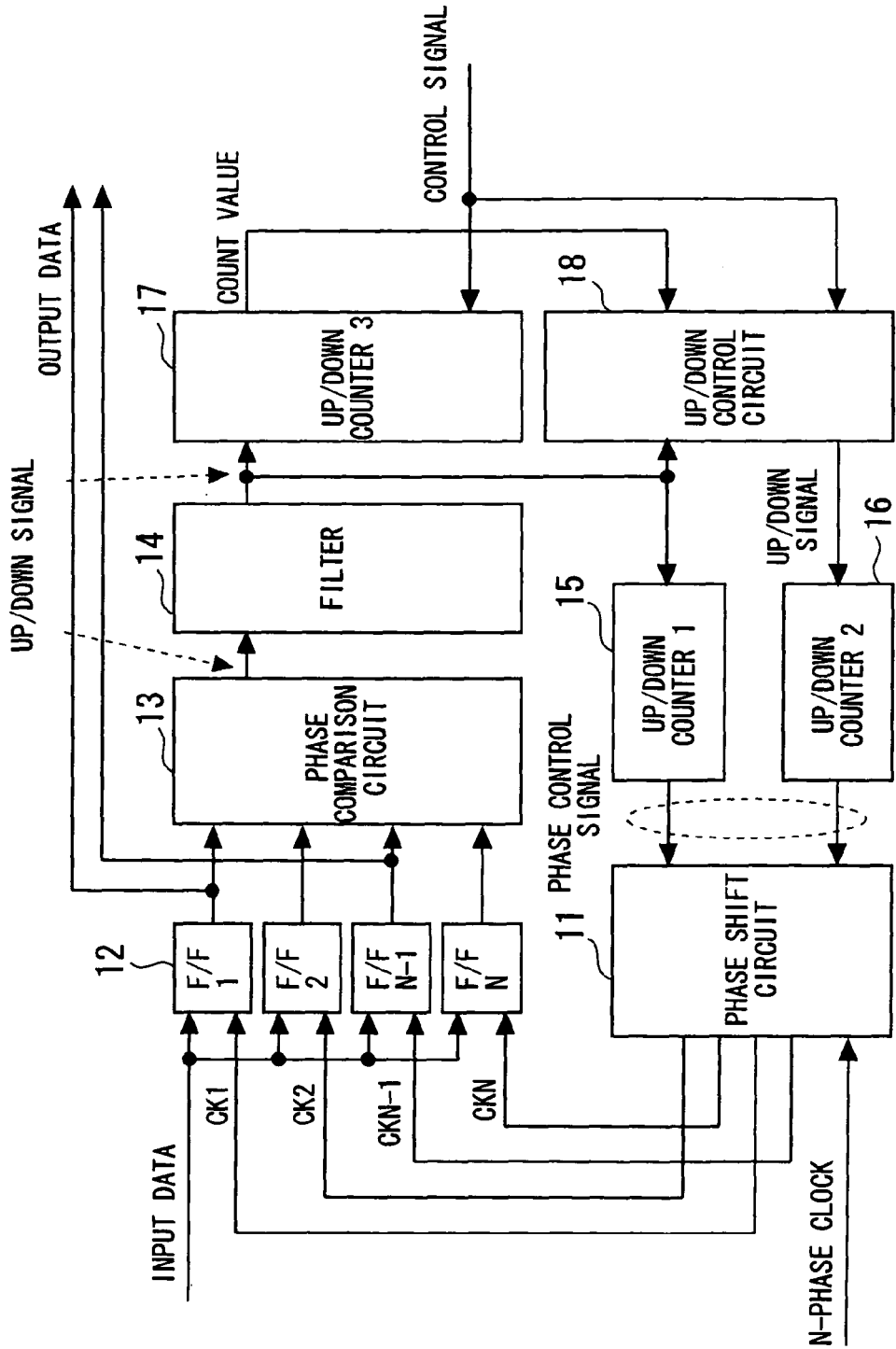
FIG. 1 is a diagram showing a configuration of an embodiment of the present invention.

The embodiment of the present invention will be described with reference to appended drawings. A clock and data recovery circuit of the present invention includes a circuit unit for generating phase control signals each for controlling a delay or an advance in phases of clock signals of a multi-phase clock signal supplied to a plurality of latch circuits (indicated by reference numeral 12 in FIG. 1) from a phase shift circuit (indicated by reference numeral 11 in FIG. 1), based on a result of phase comparison using data sampled by the latch circuits (indicated by reference numeral 12 in FIG. 1) and supplying the generated phase control signals to the phase shift circuit (indicated by reference numeral 11 in FIG. 1). Predetermined ones of the clock signals of the multi-phase clock signal are set as clock signals for edge detection each for detecting a transition point of an input data signal and the other clock signals are set as clock signals for data sampling for sampling the input data signal. The phase shift circuit adjustably shifting the phases of the clock signals for edge detection and the phases of the clock signals for data sampling based on the phase control signals, thereby recovering the data and the clock signal. In this clock and data recovery circuit, control over the phases of the clock signals for edge detection is performed by one of the phase control signals in accordance with a count value of an up/down counter (indicated by reference numeral 15 in FIG. 1) to be subject to an up/down control based on the result of the phase comparison (such as an output of a filter 14 in FIG. 1). Then, control over the phases of the clock signals for data sampling is not made to follow a count value of an up/down counter (indicated by reference numeral 17 in FIG. 1) subjected to the up/down control based on the result of the phase comparison (such as the output of the filter 14 in FIG. 1) without alteration. The clock and data recovery circuit includes a circuit unit (indicated by reference numerals 18 and 16 in FIG. 1) for performing step-wise variable control in plural stages so that when the advance or delay in the phases of the clock signals with respect to the input data signal satisfies a predetermined condition based on the current count value of the up/down counter (indicated by reference numeral 17 in FIG. 1) and the result of the phase comparison, the phases of the clock signals for data sampling are advanced or delayed.

More specifically, the control over the phases of the clock signals for edge detection is performed by the one of the phase control signals in accordance with the count value of the up/down counter (indicated by reference numeral 15 in FIG. 1) subjected to the up/down control based on the result of the phase comparison. Then, the clock and data recovery circuit includes the control circuit (indicated by reference numeral 18 in FIG. 1) that performs control so that when the current count value of the up/down counter in a first stage (indicated by reference numeral 17 in FIG. 1) subjected to the up/down control based on the result of the phase comparison satisfies a predetermined condition such as the current count value being a maximum value or a minimum value and when the result of the phase comparison (such as the output of the filter 14 in FIG. 1) indicates an up or down operation, the up/down counter in a second stage (indicated by reference numeral 16 in FIG. 1) is counted up or down. Then, the control over the phases of the clock signals for data sampling is performed by the other one of the phase control signals in accordance with a count value of the up/down counter in the second stage. The present invention may be configured so that the maximum and minimum values of the count values of the up/down counter in the first stage (indicated by reference numeral 17 in FIG. 1) for controlling the phases of the clock signals for data sampling are adjustably controlled. In the present invention, a count value range of the up/down counter in the first stage for controlling the phases of the clock signals for data sampling may be set to be narrower than count value ranges of the up/down counters (indicated by reference numerals 15 and 16 in FIG. 1). A description will be given below in connection with an embodiment.

Embodiment

FIG. 1 is a diagram showing a configuration according to an embodiment of the present invention. Referring to FIG. 1, a clock and data recovery circuit according to the embodiment of the present invention receives an input data signal and includes N latch circuits 12 (constituted from flip-flops F/F1 to F/FN) for sampling the input data signal responsive to multiple phases of clock signals (constituted from N-phase clocks CK1 to CKN) from a phase shift circuit 11, respectively to output the sampled signals, a phase comparison circuit 13 for receiving outputs from the N latch circuits 12 (constituted from the F/F1 to F/FN), for phase comparison, and outputting an up/down signal based on a result of the comparison, a filter 14 for smoothing the up/down signal indicating the result of the comparison made by the phase comparison circuit 13, a first up/down counter 15 and a third up/down counter 17 each for receiving the up/down signal smoothed by the filter 14, and performing counting up when the up/down signal indicates an up operation and performing counting down when the up/down signal indicates a down operation, an up/down control circuit 18 for receiving a count value from the third up/down counter 17 and generating a signal for controlling an up/down operation, a second up/down counter 16 for receiving the signal for the up/down operation from the up/down control circuit 18 and counting up or down a count value thereof, and the phase shift circuit 11 for receiving phase control signals output from the first up/down counter 15 and the second up/down counter 16, respectively, and respectively controlling an edge detecting clock signal for detecting a transition point of input data and a phase shift of data sampling, separately. To the phase shift circuit 11, N-phase clock signals generated by dividing a reference clock signal from a PLL circuit not shown by a divider circuit not shown are supplied. The phase shift circuit 11 is constituted from a phase interpolator for changing phases of the input N-phase clock signals according to the phase control signals. The phase interpolator may be a configuration described in Patent Document 2, or may be a configuration of differential circuits that achieves weighting of current based on the phase control signals (refer to Non-patent Document 1, for example).

An operation of the circuit shown in FIG. 1 will be described. The input data signal is sampled by the latch circuits 12 (constituted from the F/F1 to F/FN) using the N-phase clock signals CK1 to CKN, respectively. To the odd-numbered F/Fs such as the F/F1, the clock signals (CK1, ..., CKN-1) each having a rising (or falling) edge in the vicinity of a data settlement period are supplied from the phase shift circuit 11 as clock signals for data sampling. To the even-numbered F/Fs such as the F/F2, the clock signals (CK2, ..., CKN) each having a rising (or a falling) edge in the vicinity of a time point of change in data are supplied from the phase shift circuit 11 as clock signals for edge detection.

Respective data sampled by the N latch circuits 12 (constituted from the F/F1 to F/FN), respectively, are supplied to the phase comparison circuit 13. The data sampled by the odd-numbered F/Fs are output as output data. The phase comparison circuit 13 compares the data sampled in mutually adjacent phases, thereby determining a point of transition of the input data signal. When the phase of a clock signal is delayed relative to a phase of the input data signal, the phase comparison circuit 13 outputs a signal directing an up operation as the up/down signal. When the phase of the clock signal is advanced relative to the phase of the input data signal, the phase comparison circuit 13 outputs a signal directing a down operation as the up/down signal.

The filter 14 that has received the up/down signal generates the up/down signal smoothed by a majority decision circuit (not shown) therein or the like, and outputs resulting signal. When the number of up signals input over a predetermined time segment is larger than the number of down signals over the predetermined time segment, the filter 14 determines the up operation and outputs the up signal. When the number of the up signals input over the predetermined time segment is smaller than the number of the down signals over the predetermined time segment, the filter 14 determines the down operation, and outputs the down signal. The filter 14 may be the one that performs smoothing, and may be constituted from an integrator circuit, for example.

The third up/down counter 17 is the up/down counter for increasing or decreasing a count value according to the up/down signal from the filter 14. An initial value, a maximum value, and a minimum value of the count values are adjustably set according to an input control signal.

Upon receipt of the up signal from the filter 14 when the count value of the third up/down counter 17 is the maximum value, the up/down control circuit 18 outputs the up signal to the second up/down counter 16.

Upon receipt of the down signal from the filter 14 when the count value of the third up/down counter 17 is the minimum value, the up/down control circuit 18 outputs the down signal to the second up/down counter 16. The first up/down counter 15 and the second up/down counter 16 have the same configuration to each other, and count up or down according to the up/down signals, respectively. Then, respective conversions to the phase control signals are performed, and the phase control signals are output to the phase shift circuit 11.

The phase shift circuit 11 determines the phases of the clock signals (clock signals for edge detection) to be input to the even-numbered F/Fs of the latch circuit 12 according to the phase control signal from the first up/down counter 15. The phase shift circuit 11 determines the phases of the clock signals (clock signals for data sampling) to be input to the odd-numbered F/Fs according to the phase control signal from the up/down counter 2.

The clock signals for data sampling to be supplied to the latch circuits 12 from the phase shift circuit 11 are controlled through the third up/down counter 17 and the up/down control circuit 18 in addition to the filter 14. A jitter suppression range can be thereby controlled by the control signal input to the third up/down counter 17 and the up/down control circuit 18.

The maximum value among the count values of the third up/down counter 17 to be set by the control signal input to the third up/down counter 17 and the up/down control circuit 18 determines the suppression range in a direction where the phases are delayed. The minimum value among the count values of the third up/down counter 17 to be set by the control signal determines the suppression range in a direction where the phases are advanced.

Figure 2:
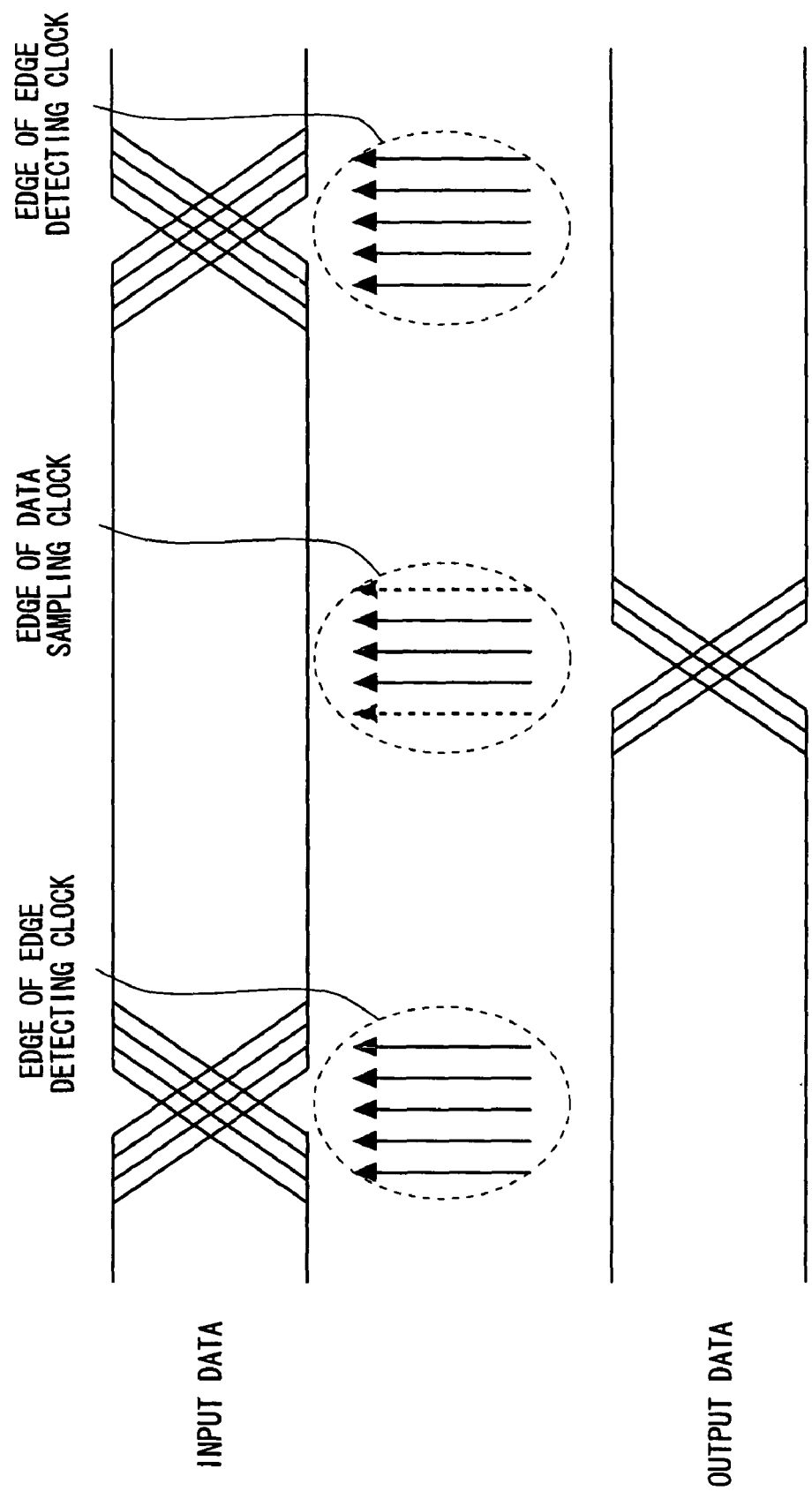
FIG. 2 is a timing waveform diagram for explaining an operation of the embodiment of the present invention.

A description will be given with reference to a timing waveform in FIG. 2. When a range of the count values of the third up/down counter 17, though not specifically limited, is set to −1, 0, and +1, for example, using the control signal, the most advanced phase and the most delayed phase in a phase selection range of the clock signals for edge detection are cancelled in the clock signals for data sampling, as shown in FIG. 2. Jitter of an output data signal is thereby suppressed. That is, phases of the clock signals for data sampling corresponding to the most advanced phase and the most delayed phase in the phase selection range of the clock signals for edge detection are limited in the clock signals for data sampling, respectively, and are not output.

When a count value of the first up/down counter 15 and the count value of the third up/down counter 17 are both zero, and when the signal indicating the up operation from the filter 14 is continuously input twice, the count value of the first up/down counter 14 is counted up twice, thereby becoming +2. At this point, the count value of the second up/down counter 16 is +1. That is, though the count value of the third up/down counter 17 becomes +1 (maximum value) upon receipt of the first up signal from the filter 14, the up/down control circuit 18 does not output the up signal to the second up/down counter 16. For this reason, the count value of the second up/down counter 16 remains at zero. When the third up/down counter 17 receives the second up signal from the filter 14 in this state, the current count value of the third up/down counter 17 is kept at the maximum value of +1. However, upon receipt of input of the up signal, the up/down control circuit 18 outputs the up signal to the second up/down counter 16. Then, the second up/down counter 16 counts up the count value by one, thereby causing the count value to become +1. With regard to the down signal as well, the count value just becomes a minus value. The operation that is the same as the one described above is performed.

In the present embodiment, a counting range of the third up/down counter 17 is set to be narrower than counting ranges (maximum value−minimum value+1) of the first up/down counter 15 and the second up/down counter 16. In the present embodiment, phases of the clock signals for data sampling are adjustably controlled in stages through the up/down counter 17 in a first stage, up/down control circuit 18, and up/down counter 16. On the other hand, each edge detecting clock signal for detecting a transition point in the input data signal is directly subject to adjustable control in a large counting range by an output of the first up/down counter 15, and maintains a follow-up characteristic for the input data signal including the jitter.

According to the present embodiment, the jitter in each data sampling clock signal is controlled in stages. The jitter in the clock signal recovered by the clock signal data recovery circuit can be thereby suppressed to an optical range.

Figure 3:
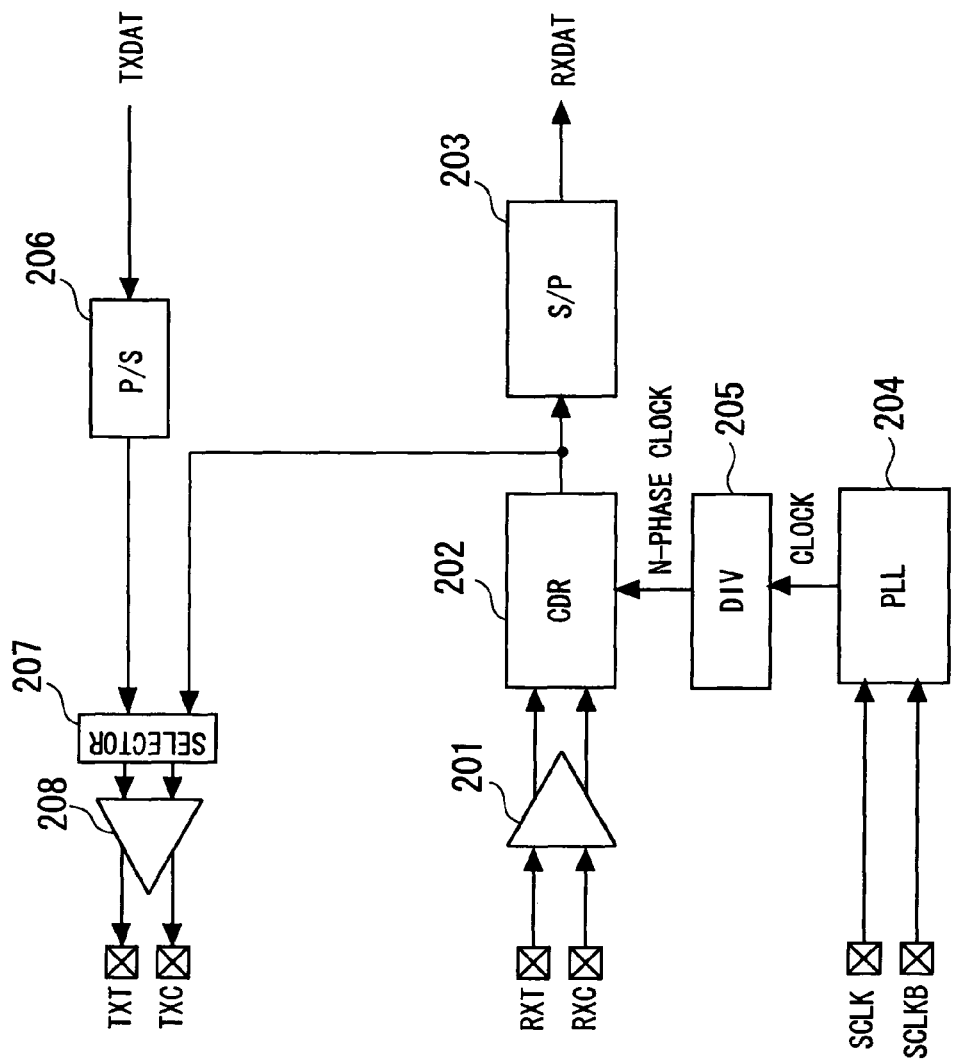
FIG. 3 is a diagram schematically showing a configuration of a SerDes interface circuit to which the clock and data recovery circuit according to the embodiment of the present invention is applied.
Figure 4:
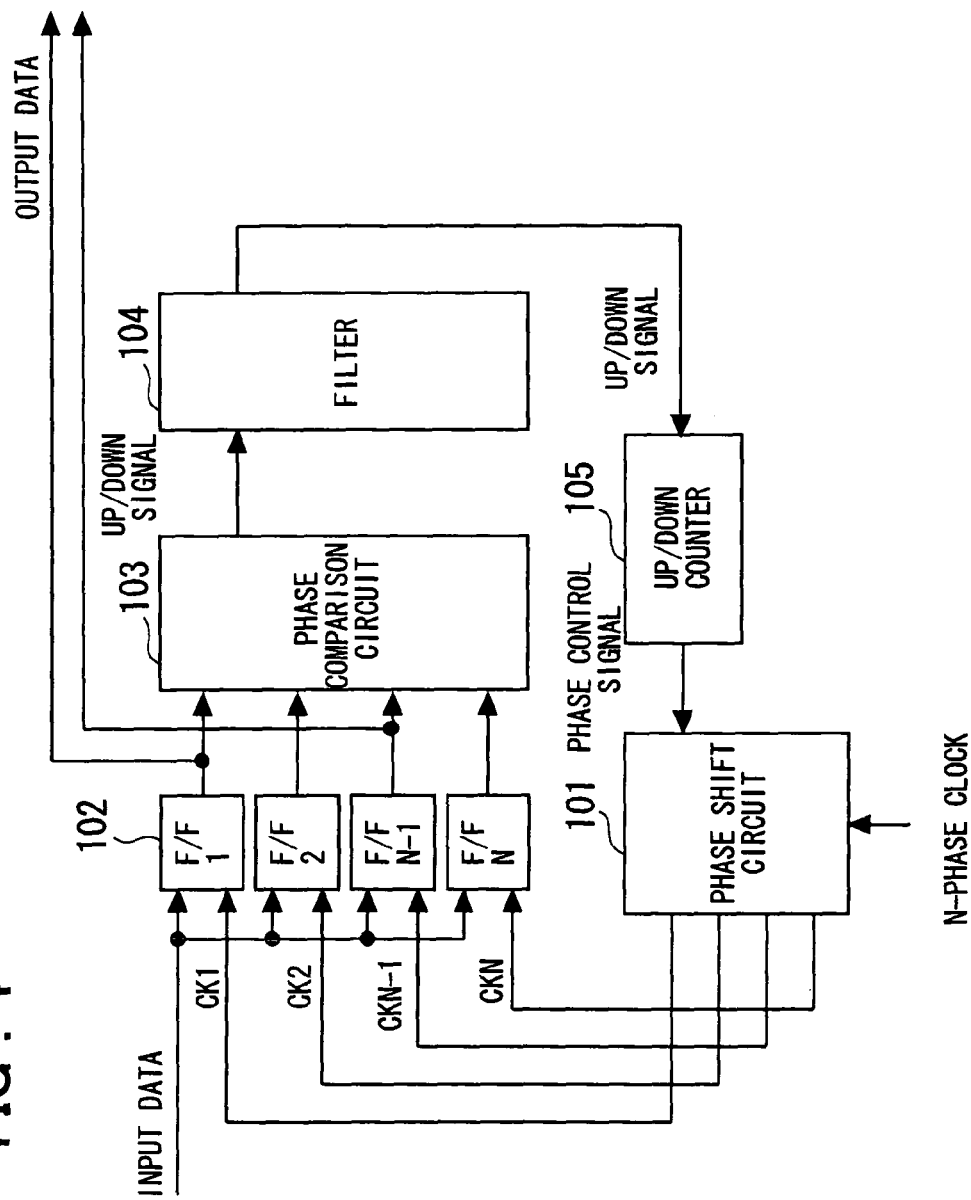
FIG. 4 is a diagram showing an example of a typical configuration of a clock and data recovery circuit.
Figure 5:
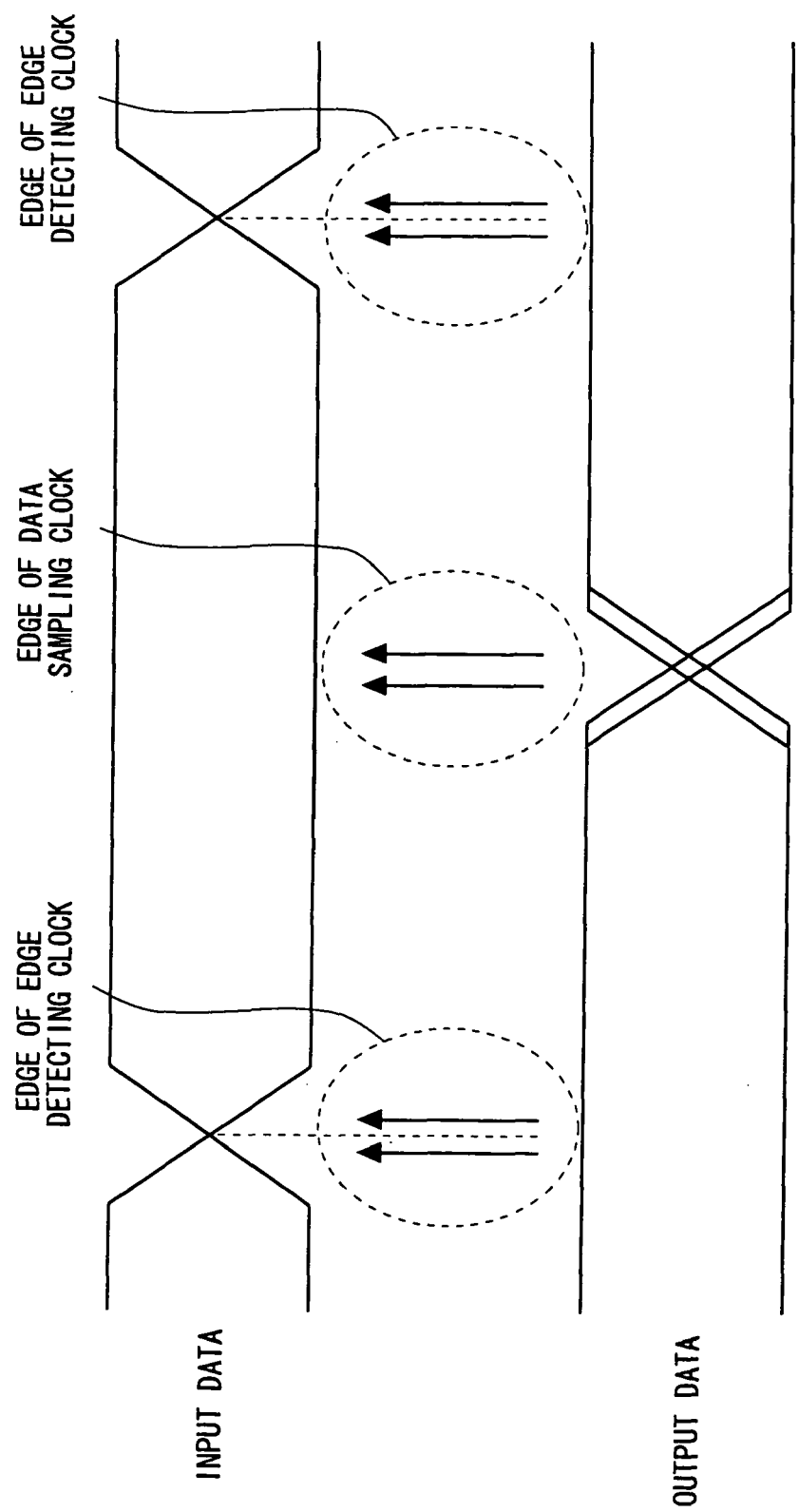
FIG. 5 is a timing waveform diagram showing an operation of the circuit in FIG. 4.
Figure 6:
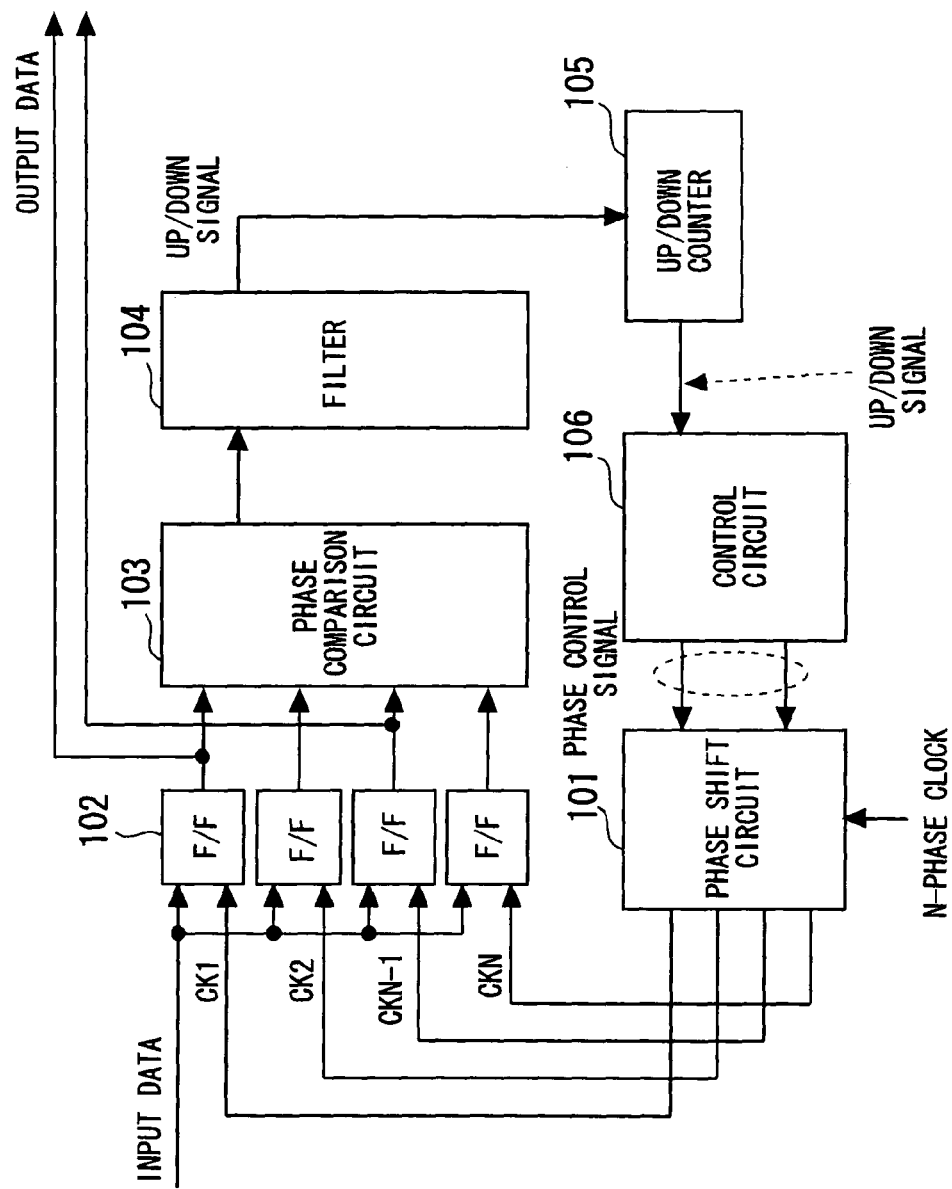
FIG. 6 is a diagram showing an example of another configuration of a conventional clock and data recovery circuit.

The clock and data recovery circuit in the present embodiment is made suitable for being applied to an interface circuit (semiconductor device) including a serializer/deserializer. FIG. 3 shows an example of a configuration of a serial interface circuit to which the clock and data recovery circuit of the present invention has been applied. Referring to FIG. 3, the clock and data recovery circuit is made suitable for being applied to the interface circuit including a clock and data recovery circuit 202 for recovering data and a clock signal from serial data differentially input to an input buffer 201 from differential input terminals RXT and RXC, a deserializer including a serial-to-parallel converting circuit 203 for converting the serial data to parallel data, a parallel-to-serial conversing circuit 206 for converting parallel data for transmission to serial data, a selector 207 for performing selection between the serial data (through data) from the clock and data recovery circuit 202 and the serial data from the parallel-to-serial converting circuit 206, and an output buffer circuit 208 (that may include a pre-emphasis function and a de-emphasis function) for outputting outputs of the selector 207 to transmission paths. The serial-to-parallel converting circuit 203 is driven by a frequency-divided clock signal from a counter (not shown) for receiving the clock signal from the clock and data recovery circuit 202. The parallel-to-serial converting circuit 206 is driven by a frequency-divided clock signal from a counter (not shown) for receiving a clock signal from a PLL (phase locked loop) circuit 204. A frequency divider circuit 205 frequency divides the clock signal from the PLL circuit 204, thereby generating a multi-phase (N-phase) clock signal, for supply to the phase shift circuit of the clock and data recovery circuit 202. As the through data from the clock and data recovery circuit 202, the serial data with the jitter component of an input data signal suppressed and correctly sampled is output, so that a circuit for correcting the jitter or the like is not necessary for a path for the through data. Incidentally, referring to FIG. 3, the clock and data recovery circuit 202 differentially receives data signals from an input buffer 201. In this case, each latch circuits 12 in FIG. 1 is constituted from a differential circuit.

The above description was given in connection with the embodiment described above. The present invention, however, is not limited to a configuration of the embodiment described above and of course includes various variations and modifications that could be made by those skilled in the art within scopes of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit comprising:
   a plurality of latch circuits for receiving and sampling an input data;
   a phase shift circuit for supplying multiple phases of clock signals having mutually distinct phases of said clock signals to said plurality of latch circuits, respectively; and
   a circuit unit for generating phase control signals for controlling a delay or an advance of the multiple phases of clock signals supplied to said plurality of latch circuits from said phase shift circuit, based on a result of a phase comparison using data sampled by said latch circuits and supplying the generated phase control signals to said phase shift circuit,
   wherein predetermined ones of the multiple phases of clock signals are set as clock signals for edge detection, each of the predetermined ones for detecting a transition point of an input data signal, the other clock signals being set as data sampling clock signals for sampling the input data signal, respectively,
   said phase shift circuit adjustably shifting the phases of the clock signals for edge detection and the phases of the data sampling clock signals based on the phase control signals, thereby recovering the data and the clock signal,
   said circuit unit including a first up/down counter which is subjected to an up/down control based on the result of the phase comparison,
   said circuit unit performing control so that control over the phases of the clock signals for edge detection is performed by an associated phase control signal in accordance with a count value of said first up/down counter, and control over the phases of the data sampling clock signals is performed by associated phase control signals from a second up/down counter in step-wise variable control in which the phases of the data sampling clock signals are advanced or delayed according to when a combination of a current count value of said second up/down counter and the result of the phase comparison satisfies a predetermined condition, wherein the shifting of the phases of the data sampling clock signals does not directly follow the count value of said first up/down counter.

2. The clock and data recovery circuit according to claim 1, wherein the control over the phases of the edge detecting clock signals is performed by the one of the phase control signals in accordance with the count value of said first up/down counter subjected to the up/down control based on the result of the phase comparison, and said circuit unit, for controlling the phases of the data sampling clock signals, further includes:
  the second up/down counter;
  a third up/down counter subjected to the up/down control based on the result of the phase comparison; and
  a control circuit for performing control so that when a current count value of the third up/down counter comprises a maximum value and the result of the phase comparison indicates an up operation, the second up/down counter is counted up, and when the current count value of the third up/down counter comprises a minimum value and the result of the phase comparison indicates a down operation, the second up/down counter is counted down; and the control over the phases of the data sampling clock signals is performed by another one of the phase control signals in accordance with a count value of the second up/down counter.

3. The clock and data recovery circuit according to claim 2, wherein a control signal for controlling the maximum and minimum values of the count values of the third up/down counter for controlling the phases of the data sampling clock signals is input, so that the maximum and minimum values of the third up/down counter can be adjustably set.

4. The clock and data recovery circuit according to claim 2, wherein a count value range of the third up/down counter for controlling the phases of the data sampling clock signals is set to be narrower than a count value range of the second up/down counter.

5. A semiconductor device including the clock and data recovery circuit as in claim 1.

6. An interface circuit comprising:
the clock and data recovery circuit as in claim 1;
an input buffer for receiving input serial data, said clock and data recovery circuit receiving the input serial data from said input buffer;
a selector for receiving a data signal output from the clock and data recovery circuit and output serial data for transmission and for outputting one of the data signal and the output serial data; and
an output buffer for receiving the output of said selector, for output.

7. The clock and data recovery circuit according to claim 1, wherein said multiple phases of clock signals comprise N (N is an even integer at least 2) mutually distinct phases.

8. The clock and data recovery circuit according to claim 7, wherein said N phases are evenly spaced 360°/N apart.

9. The clock and data recovery circuit according to claim 2, wherein the maximum value among the count values of the third up/down counter determines a jitter suppression range in a direction in which the phases are delayed, and the minimum value among the count values of the third up/down counter determines a suppression range of the jitter in a direction in which the phases are advanced.

10. The clock and data recovery circuit according to claim 9, wherein
the jitter comprises a jitter in the clock signal recovered by the clock signal data recovery circuit, and
said jitter is suppressed to an optical range.

11. The clock and data recovery circuit according to claim 9, wherein
a most advanced phase and a most delayed phase in a phase selection range of the clock signals for edge detection are canceled in the clock signals for data sampling, and
the jitter comprises a jitter of an output data signal.

12. A clock and data recovery circuit comprising:
a plurality of latch circuits for sampling an input data signal responsive to multiple phases of clock signals;
one group of said plurality of latch circuits receiving clock signals for edge detection from among said multiple phases of clock signals, respectively, to detect a transition point of the input data signal; and the other group of said plurality of latch circuits receiving clock signals for data sampling among said multiple phases of clock signals, respectively to sample the input data signal;
a phase comparison circuit for receiving outputs of said plurality of latch circuits, detecting an advance or a delay in the phase of the clock signal relative to the phase of the input data signal based on outputs of said plurality of latch circuits and for outputting an up/down signal;
a filter for smoothing the up/down signal from said phase comparison circuit and for outputting the smoothed up/down signal;
a first up/down counter for receiving the smoothed up/down signal from said filter, counting up or down a count value thereof, and for outputting a first phase control signal;
a second up/down counter for outputting a second phase control signal;
a third up/down counter for receiving the smoothed up/down signal from said filter and for counting up or down a count value thereof;
a phase shift circuit for receiving the first phase control signal from said first up/down counter and the second phase control signal from said second up/down counter and for variably and separately controlling phases of the clock signals for edge detection and phases of the clock signals for data sampling, respectively; and
an up/down control circuit for receiving the count value of said third up/down counter and the up/down signal from said filter and for generating a signal controlling counting up or down of said second up/down counter based on the count value of said third up/down counter and the up/down signal from said filter to supply the generated signal to said second up/down counter.

13. The clock and data recovery circuit according to claim 12, wherein said third up/down counter is adapted to receive a control signal controlling maximum and minimum values of the count values of said third up/down counter, so that the maximum and minimum values of the count values of said third up/down counter are variably set.

14. The clock and data recovery circuit according to claim 12, wherein said up/down control circuit supplies an up signal to said second up/down counter when the count value of said third up/down counter comprises a maximum value and when said up/down control circuit receives the up signal from said filter; and said up/down control circuit supplies a down signal to said second up/down counter when the count value of said third up/down counter comprises a minimum value and when said up/down control circuit receives the down signal from said filter.

15. The clock and data recovery circuit according to claim 12, wherein a count value range of said third up/down counter is set to be narrower than a count value range of said second up/down counter.

16. The clock and data recovery circuit according to claim 12, wherein said first up/down counter and said second up/down counter comprise a same configuration and count value ranges of said first and second up/down counters are set to comprise a same range.

17. The clock and data recovery circuit according to claim 12, wherein a first group of said latch circuits comprises odd-numbered latch circuits, wherein a second group of said latch circuits that are not in said first group of latch circuits comprises even-numbered latch circuits, wherein the first group of said latch circuits receives ones of odd-numbered phases of said clock signals of the multiple phases of clock signals, each odd-numbered phase of the clock signal having a transition edge in a vicinity of a data settlement period of the input data signal, respectively, and the second group of said latch circuits receives ones of even-numbered phases of said clock signals of the multiple phases of clock signals, each even-numbered phase of the clock signal having a transition edge in a vicinity of a time point of transition of the input data signal, respectively.

18. The clock and data recovery circuit according to claim 12, wherein said filter smoothes said up/down signal by a majority decision circuit.

19. The clock and data recovery circuit according to claim 12, wherein said filter comprises an integrator circuit.

20. The clock and data recovery circuit according to claim 12, wherein the filter determines an up operation and outputs an up signal when a number of up signals input to the filter over a predetermined time segment is larger than a number of down signals input to the filter over the predetermined time segment, and the filter determines a down operation and outputs a down signal when the number of up signals input to the filter over the predetermined time segment is smaller than the number of down signals input to the filter over the predetermined time segment.

* * * * *

UNITED STATES PATENT AND TRADEMARK OFFICE
CERTIFICATE OF CORRECTION

PATENT NO. : 7,756,232 B2 Page 1 of 1
APPLICATION NO. : 11/510669
DATED : July 13, 2010
INVENTOR(S) : Yasushi Aoki et al.

It is certified that error appears in the above-identified patent and that said Letters Patent is hereby corrected as shown below:

Title Page should read
(73) Assignee: NEC Electronics Corporation
Kawasaki, Kanagawa (JP)

Signed and Sealed this

Thirty-first Day of August, 2010

David J. Kappos
*Director of the United States Patent and Trademark Office*